(12) United States Patent
Karlsson et al.

(10) Patent No.: US 10,890,608 B2
(45) Date of Patent: Jan. 12, 2021

(54) SYSTEM AND METHOD TO DETERMINE A CAPACITANCE OF A CAPACITOR

(71) Applicant: TELEFONAKTIEBOLAGET L M ERICSSON (PUBL), Stockholm (SE)

(72) Inventors: Magnus Karlsson, Oskarshamn (SE); Jonas Malmberg, Färjestaden (SE); Fredrik Wahledow, Färjestaden (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 136 days.

(21) Appl. No.: 16/316,130

(22) PCT Filed: Jul. 8, 2016

(86) PCT No.: PCT/IB2016/054125
§ 371 (c)(1),
(2) Date: Jan. 8, 2019

(87) PCT Pub. No.: WO2018/007858
PCT Pub. Date: Jan. 11, 2018

(65) Prior Publication Data
US 2019/0317141 A1    Oct. 17, 2019

(51) Int. Cl.
*G01R 27/26* (2006.01)
*H02M 1/32* (2007.01)
(Continued)

(52) U.S. Cl.
CPC .......... *G01R 27/2605* (2013.01); *H02M 1/32* (2013.01); *H02M 1/36* (2013.01); *H02M 3/157* (2013.01);
(Continued)

(58) Field of Classification Search
CPC ........ G01R 27/00; G01R 27/02; G01R 27/26; G01R 27/2605; H02M 1/00; H02M 1/32;
(Continued)

(56) References Cited

U.S. PATENT DOCUMENTS 7,923,974 B2 * 4/2011 Martin ................. H02M 3/157
                                              323/212
7,990,097 B2 * 8/2011 Cheng ................ H02M 5/4585
                                              318/800
(Continued)

FOREIGN PATENT DOCUMENTS

EP        2704300 A1     3/2014
WO    2010/149234 A1    12/2010

OTHER PUBLICATIONS

First Examination Report, Indian Application No. 201817047720, dated Jan. 29, 2020, 6 pages.

*Primary Examiner* — Hoai-An D. Nguyen
(74) *Attorney, Agent, or Firm* — Sage Patent Group

(57) ABSTRACT

A system and method to determine a capacitance of a capacitor. In one embodiment, a power converter includes a controller coupled to an output capacitor and a power train configured to convert an input voltage to a nominal output voltage. The controller is configured to ramp up an output voltage of the power converter with a first slope and a second slope, and receive a first output current of the power converter during a first rise time associated with the first slope and a second output current of the power converter during a second rise time associated with the second slope. The controller is also configured to compute a capacitance of the output capacitor employing the first and second output currents, the first and second rise times, and the nominal output voltage.

17 Claims, 8 Drawing Sheets

(51) Int. Cl.
  *H02M 1/36* (2007.01)
  *H02M 3/157* (2006.01)
  *H02M 3/335* (2006.01)
  H02M 3/156 (2006.01)
  G01D 5/24 (2006.01)

(52) U.S. Cl.
  CPC .......... *H02M 3/33592* (2013.01); *G01D 5/24* (2013.01); *G01R 27/26* (2013.01); *H02M 3/156* (2013.01)

(58) Field of Classification Search
  CPC ............ H02M 1/36; H02M 3/00; H02M 3/02; H02M 3/04; H02M 3/10; H02M 3/145; H02M 3/155; H02M 3/156; H02M 3/157; H02M 3/33515; H02M 3/33576; H02M 3/33592; G01D 5/00; G01D 5/12; G01D 5/14; G01D 5/24; G01D 5/241; G01D 5/2412; G01D 5/2417
  USPC ........ 324/600, 649, 658, 686; 702/1, 47, 52; 340/500, 545.2, 545.4, 561, 562
  See application file for complete search history.

(56) References Cited

U.S. PATENT DOCUMENTS

| | | | |
|---|---|---|---|
| 2008/0157743 A1* | 7/2008 | Martin | H02M 3/1584 323/284 |
| 2013/0127429 A1* | 5/2013 | Li | H02M 1/36 323/282 |
| 2015/0035551 A1 | 2/2015 | Katta et al. | |
| 2016/0141954 A1* | 5/2016 | Kelly | H02M 3/157 323/234 |
| 2018/0375429 A1* | 12/2018 | Trichy | H02M 3/1563 |

* cited by examiner

SYSTEM AND METHOD TO DETERMINE A CAPACITANCE OF A CAPACITOR

RELATED APPLICATION

This application is a national stage application of International Patent Application No. PCT/IB2016/054125, filed Jul. 8, 2016, which is hereby incorporated herein by reference in its entirety.

TECHNICAL FIELD

The present invention is directed, in general, to the field of power electronics and, more specifically, to a system and method to determine a capacitance of a capacitor.

BACKGROUND

A switched-mode power converter is a type of power converter having a diverse range of applications by virtue of its small size, weight and high efficiency. For example, switched-mode power converters are widely used in personal computers and portable electronic devices such as cellphones. A switching device (e.g., a metal-oxide semiconductor field-effect transistor ("MOSFET")) of a power train of the switched-mode power converter is controlled to convert an input voltage to a desired output voltage. A frequency and duty cycle of the switching device is adjusted using a feedback signal to convert the input voltage to the desired output voltage.

A feedback loop of the power converter that provides the feedback signal may be monitored and adjusted to enhance the regulation of the output characteristic such as the output voltage. Dynamic elements of the power converter such as inductors and capacitors can affect the feedback loop design parameters. A capacitance of an output capacitor is not only dependent on internal capacitances of the power converter, but also load capacitances that can vary from application to application.

The feedback loop performance affects input and output currents produced by the power converter during startup-up as well as the ability to regulate the output characteristic in the presence of load transients. The inductors are generally included internally in the power converter design and, thus, provide known reactive values for the design of the feedback loop. The design of the feedback loop, however, is dependent on load capacitances that are unknown or only partially known during the design phase. Technical developments over time have improved electrical characteristics of capacitors such that they can have a higher capacitance in a given physical size as well as a lower equivalent series resistance ("ESR"). That being said, the unknown load capacitances still can have a significant effect on feedback loop performance.

SUMMARY

These and other problems are generally solved or circumvented, and technical advantages are generally achieved, by advantageous embodiments of the present invention for a system and method to determine a capacitance of a capacitor. In one embodiment, a power converter includes a controller coupled to an output capacitor and a power train configured to convert an input voltage to a nominal output voltage. The controller is configured to ramp up an output voltage of the power converter with a first slope and a second slope, and receive a first output current of the power converter during a first rise time associated with the first slope and a second output current of the power converter during a second rise time associated with the second slope. The controller is also configured to compute a capacitance of the output capacitor employing the first and second output currents, the first and second rise times, and the nominal output voltage. Corresponding embodiments are also applicable for a method of operating a power converter and a controller for use with a power converter.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, reference is now made to the following descriptions taken in conjunction with the accompanying drawings, in which.

Corresponding numerals and symbols in the different figures generally refer to corresponding parts unless otherwise indicated, and may not be redescribed in the interest of brevity after the first instance. The FIGUREs are drawn to illustrate the relevant aspects of exemplary embodiments.

DETAILED DESCRIPTION

Figure 1:
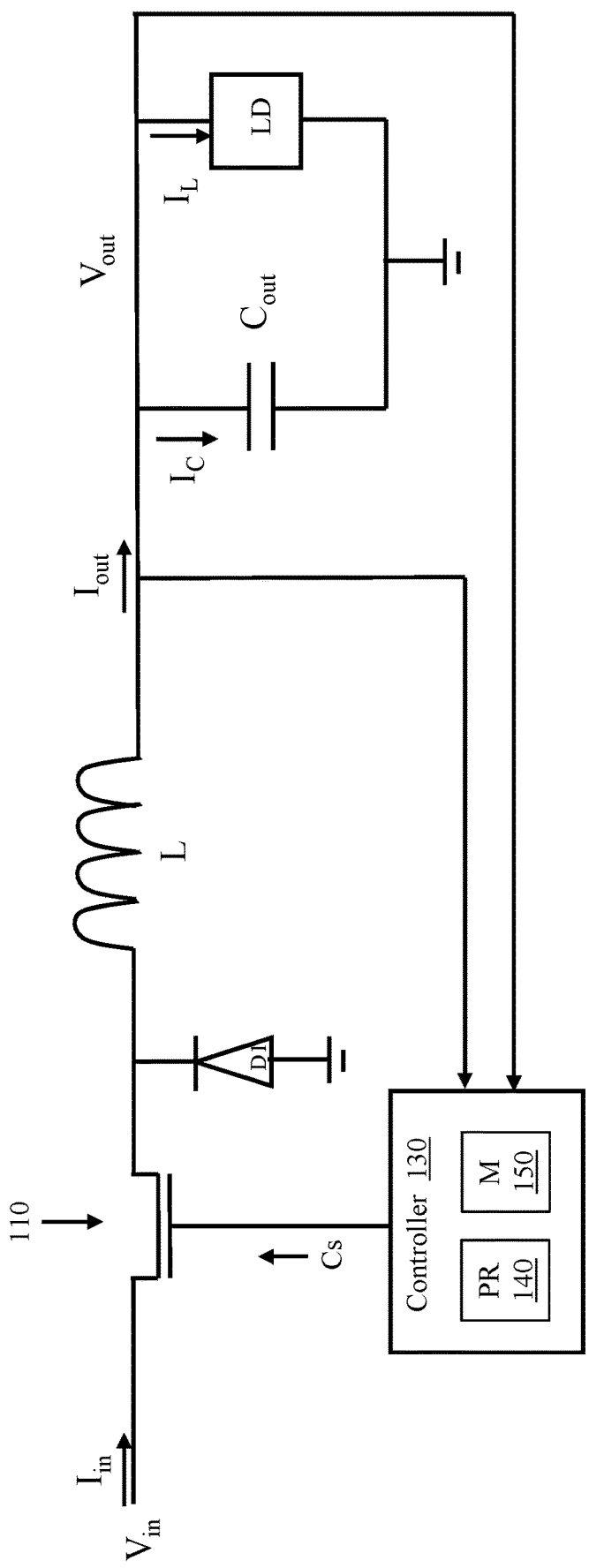
FIG. 1 illustrates a schematic diagram of an embodiment of a power converter.

The making and using of the present exemplary embodiments are discussed in detail below. It should be appreciated, however, that the embodiments provide many applicable inventive concepts that can be embodied in a wide variety of specific contexts. The specific embodiments discussed are merely illustrative of specific ways to make and use the systems, subsystems, and modules associated with determining a capacitance of a capacitor of a power converter. In view of the need to enhance a feedback loop to manage input and output characteristics of a power converter, a system and method to determine parameters of the feedback loop would be beneficial. Of consequence to that determination, a system and method to determine a capacitance of an output capacitor, especially in view of load capacitances would improve the design of the feedback loop.

A process will be described herein with respect to exemplary embodiments in a specific context, namely, a system and method operable to identify a capacitance of an output capacitor of a power converter. While the principles will be described in the environment of a power converter, a motor controller, or power amplifier that may benefit from such a system and method that enables these functionalities is well within the broad scope of the present disclosure.

In order to enhance the performance of a feedback loop in a power converter, system dynamic components such as an output capacitance should be properly identified. A common method in system identification is to superimpose a disturbance on an internal signal and analyze what happens on the output, for example, as described in "System Identification—Theory for the User" by L. Ljung (Prentice-Hall, Englewood Cliffs, ISBN 0-13-B81640, 1987). Such a disturbance can be injected in many different ways. One way is to use relay feedback, as described in "Automatic tuning of PID controllers" by K. J. Åström and T. Hágglund (Instrument Society of America, ISBN 1-55617-081-5, 1988). Alternatively, the disturbance can be injected by inducing limit cycles or injecting a noise signal, as described in the doctoral thesis of Zhao Zhenyu, entitled "Design and Practical Implementation of Digital Auto-tuning and Fast-response Controllers for Low-power Switch-mode Power Supplies" (University of Toronto, Canada, 2008). The aforementioned references are incorporated herein by reference.

A problem with the above schemes is to control or limit an amplitude of the disturbance at the output of the power converter. The loads of the power converter sometimes have very strict requirements on overvoltage, which make such methods difficult to use. Furthermore, in some applications, particularly those in the telecommunications industry, no disturbance at all on the output voltage can be tolerated. The aforementioned methods employing feedback control employ complex calculations that take time and consume power. In addition, these solutions place heavy demands on computational resources. Other methods that involve injecting sinusoidal disturbances and using cross-correlation to determine the system's transfer function are also time consuming and use complex calculations that take time and consume power, and employ a fair amount of computation resources.

In addition, the development of new complementary metal-oxide semiconductor ("CMOS") technologies such as application specific integrated circuits ("ASICs") and field programmable gate arrays ("FPGAs") has led to tougher requirements on the current capabilities and voltage tolerance bands of the power converters. Moreover, a bank of capacitors with a mix of different capacitor types is now often used for enhancing the electrical performance of a circuit powered by the power converter. In addition, technical developments have improved the electrical characteristics of the capacitors such that they have a higher capacitance and a lower equivalent series resistance ("ESR"). Thus, the capacitive load can vary widely between different applications.

It is, therefore, highly desirable to develop a scheme to improve the feedback loop parameters in a power converter that avoids the injection of any disturbance that can cause additional noise on the output voltage of the power converter. This should include a measure of the load capacitance coupled to an output thereof. The load capacitance affects the system dynamics of the power converter and should be considered during the design of the control loop of the power converter.

Referring initially to FIG. 1, illustrated is a schematic diagram of an embodiment of a power converter. The power converter receives an input voltage $I_{in}$ and converts a direct current ("dc") input voltage $V_{in}$ (from an input power source) to a desired dc output voltage $V_{out}$. The output voltage $V_{out}$ is applied across a load (designated "LD") connected in parallel with an output capacitor $C_{out}$. An output current $I_{out}$ is split between the output capacitor $C_{out}$ (receiving a capacitor current $I_C$) and the load LD (receiving a load current $I_L$). The power converter includes an inductor L, the output capacitor $C_{out}$, a diode D1 and a power switch 110. The power converter also includes a controller 130 (including a processor ("PR") 140 and memory ("M") 150) that controls the power switch 110 to regulate the output voltage $V_{out}$ of the power converter.

The controller 130 applies a control signal Cs at an appropriate frequency (e.g., 300 kilohertz ("kHz")) to a control terminal of the power switch (also referred to as a "switching device") 110. The controller 130 regulates the output voltage $V_{out}$ by adjusting the duty cycle D of the control signal Cs (defined by $D=T_{ON}/T_{switch}$, where $T_{ON}$ is the duration of the control signal and $T_{switch}$ is the conduction interval of the power switch 110) as a function of the output current $I_{out}$ and/or the output voltage $V_{out}$. As discussed in more detail below, the controller 130 is also configured to compute a capacitance of the output capacitor $C_{out}$ of the power converter.

Although a single output capacitor $C_{out}$ is shown in the simplified diagram of FIG. 1, the power converter may use large banks of capacitors for maintaining a stable output voltage $V_{out}$ during load transients or for keeping the voltage ripple at an acceptable level. The power converter illustrated in FIG. 1 is not limited to the above-described buck topology, and the apparatus and methods introduced herein will work equally well with many topologies including push-pull, half-bridge and forward converters, etc. Further, it will be appreciated that the techniques of the solution introduced herein are applicable to various types of switched mode power supplies (e.g., dc-dc, etc).

The processor 140 may be embodied as any type of processor and associated circuitry configured to perform one or more of the functions described herein. For example, the processor 140 may be embodied as or otherwise include a single or multi-core processor, an application specific integrated circuit, a collection of logic devices, or other circuits. The memory 150 may be embodied as read-only memory devices and/or random access memory devices. For example, the memory 150 may be embodied as or otherwise include dynamic random access memory devices ("DRAM"), synchronous dynamic random access memory devices ("SDRAM"), double-data rate dynamic random access memory devices ("DDR SDRAM"), and/or other volatile or non-volatile memory devices. The memory 150 may have stored therein programs including a plurality of instructions or computer program code for execution by the processor 140 to control particular functions of the power converter as discussed in more detail below.

Figure 2:
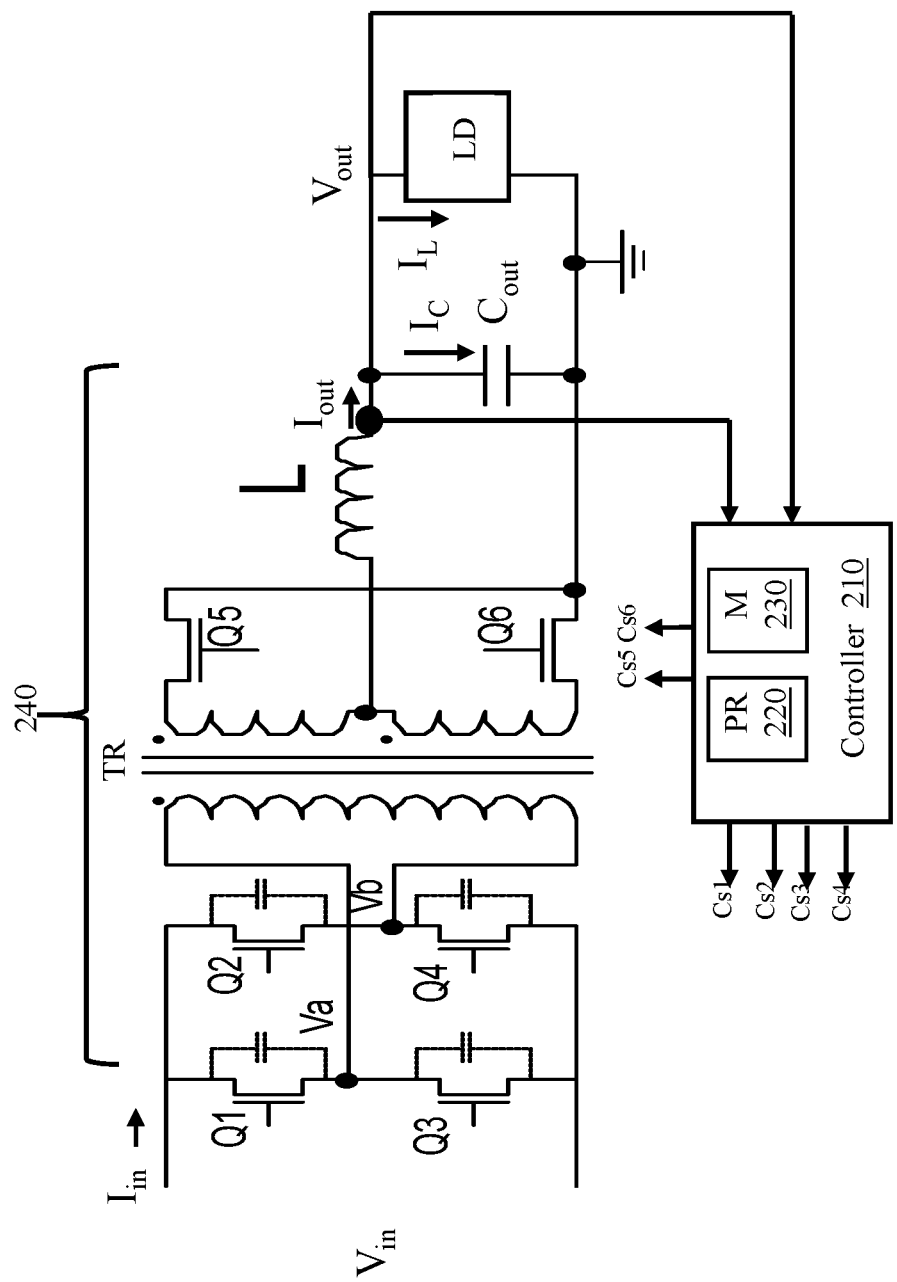
FIG. 2 illustrates a schematic diagram of another embodiment of a power converter.

Turning now to FIG. 2, illustrated is a schematic diagram of another embodiment of a power converter. A power train of the power converter receives an input voltage $I_{in}$ and an input voltage $V_{in}$ and includes first and second high-side switching devices Q1, Q2, and first and second low-side switching devices Q3, Q4 arranged in a full bridge configuration and including parasitic capacitances (illustrated with dotted lines as parallel capacitances). The first high-side switching device Q1 is coupled in series at a first circuit node Va with the first low-side switching device Q3. The second high-side switching device Q2 is coupled in series at a second circuit node Vb with the second low-side switching device Q4. The first and second circuit nodes Va, Vb are coupled to opposite ends of a primary winding of a transformer TR. A secondary winding of the transformer TR is coupled to a synchronous rectifier formed by a third low-side switching device Q5 (including a parasitic capacitance, not shown) coupled to a fourth low-side switching device Q6 (including a parasitic capacitance, not shown). A center tap of the secondary winding of the transformer TR is coupled to an output filter including output inductor L and output capacitor $C_{out}$ that filters an output voltage $V_{out}$ provided to a load (designated "LD"). An output current $I_{out}$ is split between the output capacitor $C_{out}$ (receiving a capacitor current $I_C$) and the load LD (receiving a load current $I_L$).

The first and second high-side switching devices Q1, Q2, and the first and second low-side switching devices Q3, Q4 are controlled to provide a high frequency ac voltage to the primary winding of the transformer TR. The high frequency ac voltage is impressed across to the secondary winding of the transformer TR and the third and fourth low-side switching devices Q5, Q6 are controlled to provide a rectified dc voltage. The rectified dc voltage is then filtered by the output filter, which provides the output voltage $V_{out}$ to the load LD. While the switching devices are illustrated as MOSFETs, it should be understood that any semiconductor switch technology can be used as the application dictates. Also, while the power train includes a full bridge configuration and synchronous rectifier, other topologies and rectification techniques may be employed to advantage.

A controller 210 including a processor ("PR") 220 and memory ("M") 230 receives the output current $I_{out}$ and/or the output voltage $V_{out}$ and generates control signals Cs1, Cs2, Cs3, Cs4 for the first and second high-side switching devices Q1, Q2, and first and second low-side switching devices Q3, Q4 to regulate the output voltage $V_{out}$ (an output characteristic of the power converter). The controller 210 also generates control signals Cs5, Cs6 for the synchronous rectifier formed by the third and fourth low-side switching devices Q5, Q6. A description of analogous controller 130 is described above with respect to FIG. 1. As discussed in more detail below, the controller 210 is also configured to compute a capacitance of the output capacitor $C_{out}$ of the power converter.

Figure 3:
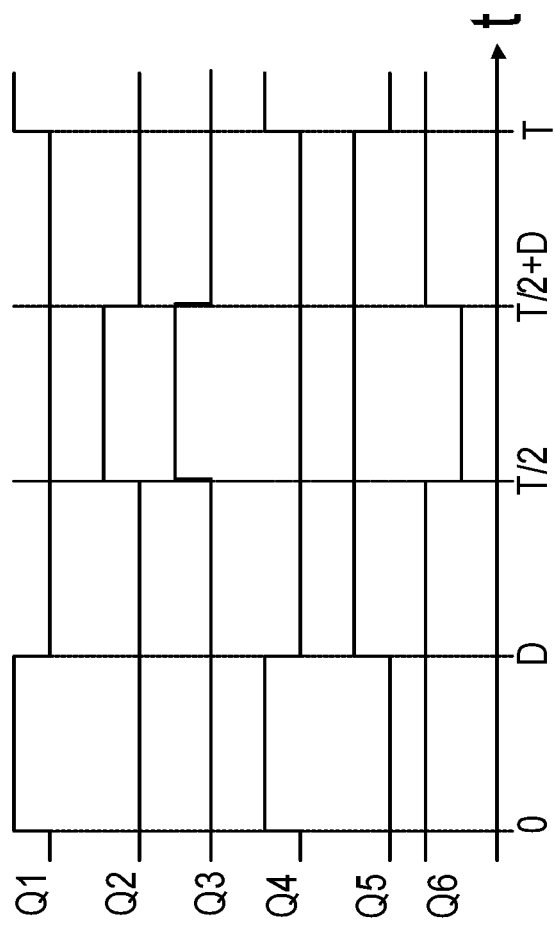
FIG. 3 illustrates timing diagrams demonstrating an operation of the power converter of FIG. 2.

Turning now to FIG. 3, illustrated are timing diagrams demonstrating an operation of the power converter of FIG. 2. The timing diagrams represent the conduction intervals for the switching devices Q1, Q2, Q3, Q4, Q5, Q6 over a switching interval T as a function of time t (on the horizontal axis). The first high-side switching device Q1 and the second low-side switching device Q4 conduct for a duty cycle D delivering energy to the transformer TR. The fourth low-side switching device Q6 is also conducting during this time. During a freewheeling phase (from the duty cycle D to half the switching interval T/2), the first and second high-side switching devices Q1, Q2, and the first and second low-side switching devices Q3, Q4 are non-conducting, and a current in the output inductor L flows through the third and fourth low-side switching devices Q5, Q6 of the synchronous rectifier.

For a period representing a duty cycle D (from half the switching interval T/2 to half the switching interval plus the duty cycle T/2+D), the second high-side switching device Q2 and the first low-side switching device Q3 conduct delivering energy to the transformer TR. The third low-side switching device Q5 is also conducting during this time. During another freewheeling phase (from half the switching interval plus the duty cycle T/2+D to the end of the switching interval T), the first and second high-side switching devices Q1, Q2, and the first and second low-side switching devices Q3, Q4 are non-conducting, and a current in the output inductor L flows through the third and fourth low-side switching devices Q5, Q6 of the synchronous rectifier.

Figure 4:
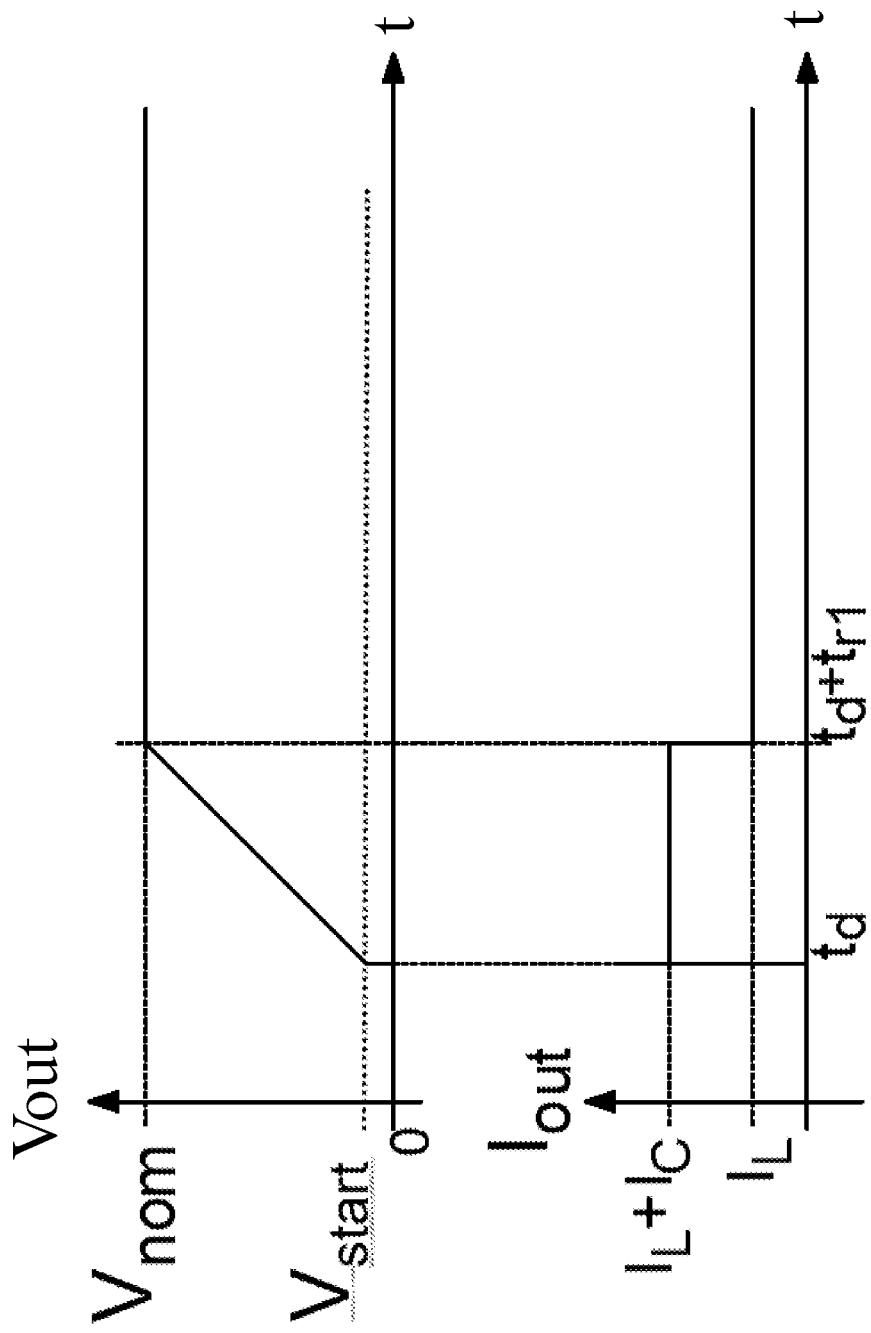
FIGS. 4 to 6 illustrate timing diagrams demonstrating operations of a power converter.

Turning now to FIG. 4, illustrated are timing diagrams demonstrating an operation of a power converter. The illustrated embodiment demonstrates an output voltage $V_{out}$ and output current $I_{out}$ of the power converter as a function of time t at start-up. The output voltage $V_{out}$, the output current $I_{out}$ and a rise time $t_{r1}$ a set forth below are employed to compute a capacitance of an output capacitor $C_{out}$ of the power converter (see, e.g., equation (9)). Through operation of the power train (e.g., the switching devices of FIG. 2), the output voltage $V_{out}$ is ramped up from an initial output voltage $V_{start}$ to a steady-state nominal output voltage (also referred to as a "nominal output voltage") $V_{nom}$. The power train starts with a minimum duty cycle $D_{min}$ and the output voltage $V_{out}$ makes a quick jump to the initial output voltage $V_{start}$ at a time $t_d$, which may include a configurable delay after a remote control signal starts the ramp-up sequence. The initial output voltage $V_{start}$ equals $n \cdot D_{min} \cdot V_{in}$, wherein "n" is a transformer turns ratio for power converters that include an isolation transformer. Otherwise, the transformer turns ratio n is set to one. This jump in duty cycle causes a current spike at an output of the power converter to charge the output capacitor $C_{out}$. Through the operation of the power train, the output voltage $V_{out}$ ramps up linearly to the steady-state nominal output voltage $V_{nom}$ at a time $t_d + t_{r1}$.

The output current $I_{out}$ begins at zero and then transitions to a sum of the load current $I_L$ and the capacitor current $I_C$ of the output capacitor $C_{out}$ at the time $t_d$. The capacitor current $I_C$ of the output capacitor $C_{out}$ can be calculated as:

$$I_C = C_{out} \frac{dV}{dt} = C_{out} \frac{V_{nom}}{t_{r1}},$$

wherein dV/dt is the slope of the output voltage $V_{out}$ and $t_{r1}$ is the rise time. The output current $I_{out}$ maintains the sum of the load current $I_L$ and the capacitor current $I_C$ until the output voltage $V_{out}$ reaches the steady-state nominal output voltage of $V_{nom}$. After reaching the steady-state nominal output voltage of $V_{nom}$, the output current $I_{out}$ levels off at the load current $I_L$.

In systems where, for example, the output capacitor $C_{out}$ is formed with a capacitor bank and the capacitance is very large, the capacitor current $I_C$ may be larger than the output current $I_{out}$ capability of the power converter. In other instances, the input current $I_{in}$ consumed by the power converter may cause problems with the power source to the power converter. The instantaneous current charging for the output capacitor $C_{out}$ generally cannot be distinguished by the power converter from the dissipative load current $I_L$ drawn by the load.

As introduced herein, the output current $I_{out}$ is measured and includes current flowing in substantially all capacitances (designated as the output capacitor $C_{out}$) coupled across the output of the power converter. If the load current $I_L$ and capacitor current $I_C$ are larger than a maximum output current $I_{max}$ of the power converter, the rise time $t_{r1}$ is adjusted so that the output current $I_{out}$ is equal to or less than the maximum output current $I_{max}$.

The process introduced herein enables computation of the value of total capacitance represented by the output capacitor $C_{out}$ coupled across the output terminals of a power converter as well as a dissipative load current $I_L$ coupled thereto. Knowing a value of total capacitance coupled across output terminals of the power converter can enable an auto-tuning procedure or algorithm in a feedback loop that makes it possible to accommodate in the feedback loop, for example, aging components and component value temperature drift in a real application.

Figure 5:
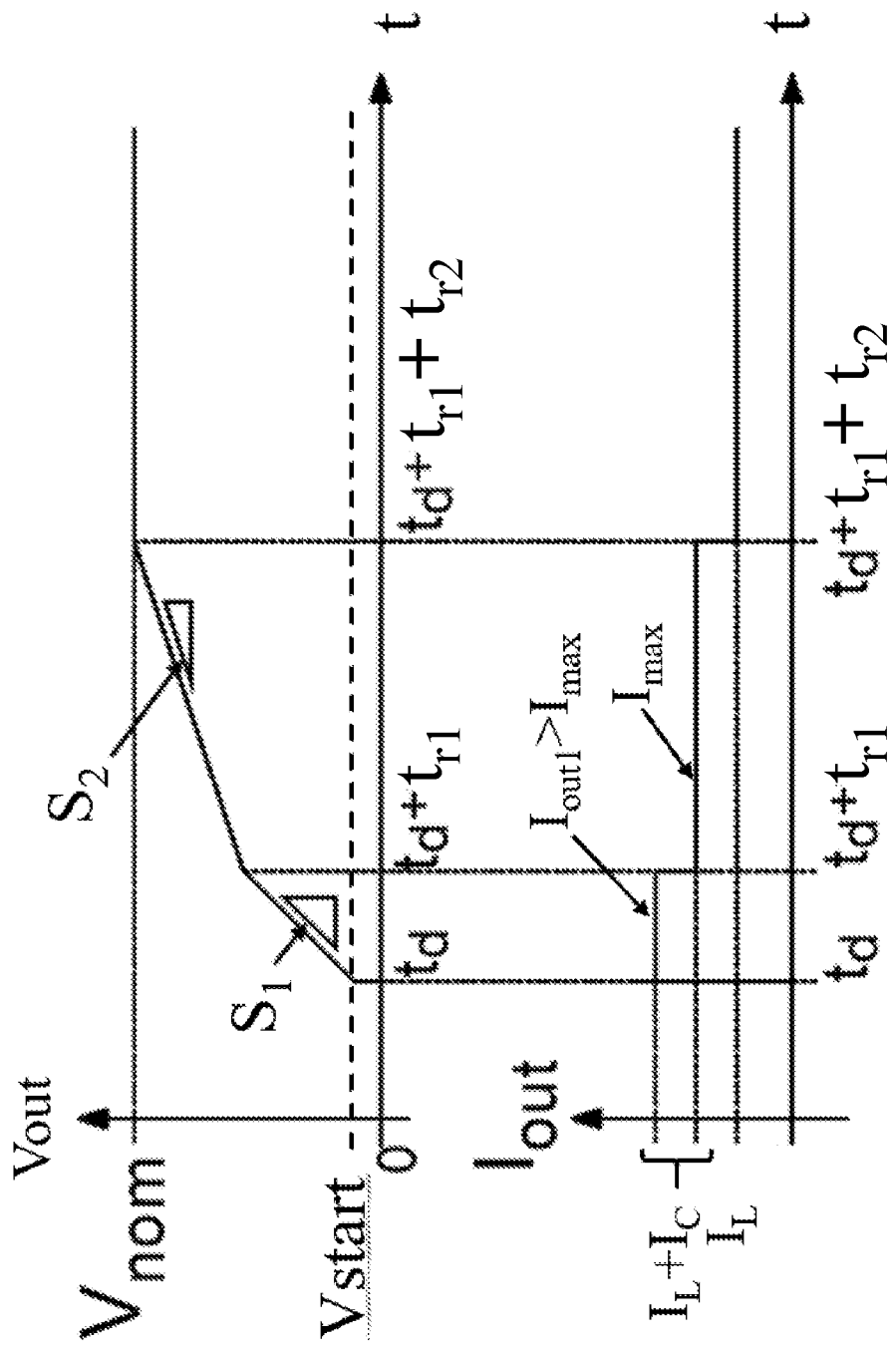

Turning now to FIG. 5, illustrated are timing diagrams demonstrating an operation of a power converter. The illustrated embodiment demonstrates an output voltage $V_{out}$ and output current $I_{out}$ of the power converter as a function of time t at start-up. The output voltage $V_{out}$, the output current $I_{out}$ and rise times $t_{r1}$, $t_{r2}$ as set forth herein are employed to compute a capacitance of an output capacitor $C_{out}$ of the power converter (see, e.g., equation (9)). Through operation of the power train (e.g., the switching devices of FIG. 2), the output voltage $V_{out}$ is ramped up from an initial output voltage $V_{start}$ to a steady-state nominal output voltage of $V_{nom}$. The power train starts with a minimum duty cycle $D_{min}$ and the output voltage $V_{out}$ makes a quick jump to the initial output voltage $V_{start}$ at a time $t_d$, which may include a configurable delay after a remote control signal starts the ramp-up sequence. As mentioned above, the initial output voltage $V_{start}$ equals $n \cdot D_{min} \cdot V_{in}$, wherein "n" is a transformer turns ratio for power converters that include an isolation transformer. Otherwise, the transformer turns ratio n is set to one. This jump in duty cycle causes a current spike at an output of the power converter to charge the output capacitor $C_{out}$. Through the operation of the power train, the output voltage $V_{out}$ ramps up linearly with a slope S1 until a time $t_d + t_{r1}$.

Regarding the output current $I_{out}$, the output current $I_{out}$ begins at zero and then transitions to a sum of the load current $I_L$ and the capacitor current $I_C$ of the output capacitor $C_{out}$ at the time $t_d$. The output current $I_{out}$ maintains the sum of the load current $I_L$ and the capacitor current $I_C$ (designated a first output current $I_{out1}$) until the time $t_d + t_{r1}$. The first output current $I_{out1}$, however, exceeds the maximum output current $I_{max}$.

Through the operation of the power train, the output voltage $V_{out}$ linearly ramps up with a reduced slope $S_2$ to the steady-state nominal output voltage $V_{nom}$ at a time $t_d + t_{r1} + t_{r2}$. As a result, the sum of the load current $I_L$ and the capacitor current $I_C$ of the output capacitor $C_{out}$ drops to the maximum output current $I_{max}$. After reaching the steady-state nominal output voltage $V_{nom}$, the output current $I_{out}$ levels off at the load current $I_L$. Thus, the rise time $t_{r2}$ and slope $S_2$ of the output voltage $V_{out}$ is adjusted so that the first output current $I_{out1}$ is reduced to the maximum output current $I_{max}$.

With continuing reference to FIGS. 4 and 5, the output current $I_{out}$ during the rise time $t_{r1}$ is given by the equation (1) below:

$$I_{out} = C_{out} \frac{V_{nom}}{t_{r1}} + I_L, \quad (1)$$

where $I_L$ is a steady dc current drawn by the load and $V_{nom}$ is the steady-state output voltage level that is generally regulated to a particular level.

If it is assumed that the maximum allowed current during the ramp-up is $I_{max}$, equation (2) below can be obtained to indicate the maximum output current $I_{max}$ dependent on a rise time $t_{r2}$:

$$I_{max} = C_{out} \frac{V_{nom}}{t_{r2}} + I_L. \quad (2)$$

The new rise time $t_{r2}$ can be solved using equation (2) above to produce equation (3) below:

$$t_{r2} = C_{out} \frac{V_{nom}}{I_{max} - I_L}. \quad (3)$$

The capacitance value of the output capacitor $C_{out}$ can be obtained from equation (1) yielding:

$$t_{r2} = C_{out} \frac{V_{nom}}{I_{max} - I_L} = t_{r1} \frac{I_{out} - I_L}{V_{nom}} \frac{V_{nom}}{I_{max} - I_L} = t_{r1} \frac{I_{out} - I_L}{I_{max} - I_L}. \quad (4)$$

Assuming the steady dc load current $I_L$ is zero in the beginning before a power-on reset of the load is performed, equation (4) can be simplified to:

$$t_{r2} = t_{r1} \frac{I_{out}}{I_{max}}. \quad (5)$$

In a common situation where the load current $I_L$ is non-zero during start-up, equation (6) below can be used to calculate the new rise time $t_{r2}$:

$$t_{r2} = t_{r1} \frac{I_{out} - I_L}{I_{max} - I_L}. \quad (6)$$

The larger the load current $I_L$, the longer the rise time, which in the extreme case produces an infinite rise time when the maximum output current $I_{max}$ equals the load current $I_L$.

In a normal case, a safety margin is used limiting the allowed maximum load current, for example, $\max[I_L] = I_{max}/4$. This yields in equation (7) the following maximum rise time for the new rise time $t_{r2}$:

$$t_{r2} = t_{r1} \frac{I_{out} - I_{max}/4}{I_{max} - I_{max}/4} = \frac{4}{3} t_{r1} \frac{I_{out} - I_{max}/4}{I_{max}} = t_{r1}\left(\frac{4 I_{out}}{I_{max}} - \frac{1}{3}\right). \quad (7)$$

If the load current $I_L$ is larger than the assumed safety margin, the output current $I_{out}$ of the power converter will be larger than the maximum output current $I_{max}$. In this case, a final adjustment to a rise time $t_{r3}$ can be made since in this case the load current $I_L$ can be calculated and adjusted with two first measurements.

Assuming that the initial rise time $t_{r1}$ is much less than the subsequent rise time $t_{r2}$ (the output voltage $V_{out}$ after the first two measurement times is much lower than the steady-state nominal output voltage $V_{nom}$) two equations are obtained with two unknowns, the output capacitor $C_{out}$ and the load current $I_L$, which can be solved using equation (8) below:

$$I_{out1} = C_{out} \frac{V_{nom}}{t_{r1}} + I_L \quad (8)$$

$$I_{out2} = C_{out} \frac{V_{nom}}{t_{r2}} + I_L,$$

which yields the capacitance of the output capacitor $C_{out}$ and the load current $I_L$ in equation (9):

$$I_L = \frac{I_{out1}t_{r1} - I_{out2}t_{r2}}{t_{r1} - t_{r2}} \quad (9)$$

$$C_{out} = \frac{t_{r1}t_{r2}}{V_{nom}} \frac{I_{out1} - I_{out2}}{t_{r1} - t_{r2}}.$$

Hence, using two measurements with two different rise times (and the corresponding slopes), the values of the output capacitor $C_{out}$ and the load current $I_L$ can be identified, which extends the results introduced by Karlsson et al., in U.S. Pat. No. 8,854,026, entitled "Capacitance Determination in a Switched Mode Power Supply," issued Oct. 7, 2014, which is incorporated herein by reference.

The final rise time $t_{r3}$ that yields a maximum output current $I_{max}$ can also be solved for using equation (10) below:

$$t_{r3} = \frac{t_{r1}t_{r2}(I_{out1} - I_{out2})}{I_{max}(t_{r1} - t_{r2}) - I_{out1}t_{r1} + t_{r2}I_{out2}}. \quad (10)$$

These calculations can be easily adjusted for the case when the output voltage $V_{out}$ changes too much compared with the steady-state nominal output voltage $V_{nom}$ for the multiple measurement periods.

Figure 6:
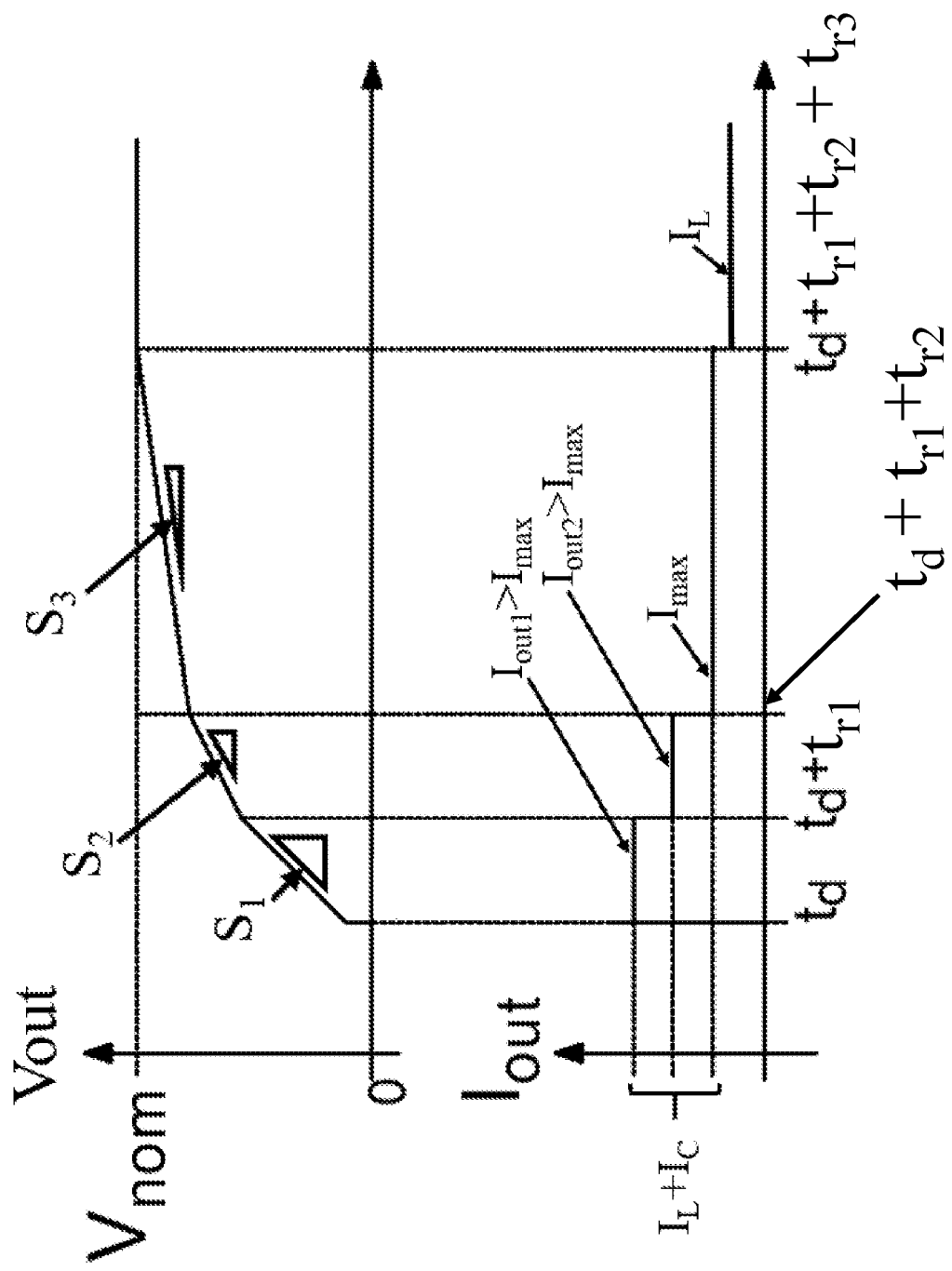

Turning now to FIG. 6, illustrated are timing diagrams demonstrating an operation of a power converter. The illustrated embodiment demonstrates an output voltage $V_{out}$ and output current $I_{out}$ of the power converter as a function of time t at start-up. The output voltage $V_{out}$, the output current $I_{out}$ and rise times $t_{r1}$, $t_{r2}$, $t_{r3}$ as set forth herein are employed to compute a capacitance of an output capacitor $C_{out}$ of the power converter (see, e.g., equations (9), (10)). Through operation of the power train (e.g., the switching devices of FIG. 2), the output voltage $V_{out}$ is ramped up from an initial output voltage $V_{start}$ to a steady-state nominal output voltage of $V_{nom}$. The power train starts with a minimum duty cycle $D_{min}$ and the output voltage $V_{out}$ makes a quick jump to the initial output voltage $V_{start}$ at a time $t_d$, which may include a configurable delay after a remote control signal starts the ramp-up sequence. As mentioned above, the initial output voltage $V_{start}$ equals $n \cdot D_{min} \cdot V_{in}$, wherein "n" is a transformer turns ratio for power converters that include an isolation transformer. Otherwise, the transformer turns ratio n is set to one. This jump in duty cycle causes a current spike at an output of the power converter to charge the output capacitor $C_{out}$. Through the operation of the power train, the output voltage $V_{out}$ ramps up linearly with a slope S1 until a time $t_d+t_{r1}$.

Regarding the output current $I_{out}$, the output current $I_{out}$ begins at zero and then transitions to a sum of the load current $I_L$ and the capacitor current $I_C$ of the output capacitor $C_{out}$ at the time $t_d$. The output current $I_{out}$ maintains the sum of the load current $I_L$ and the capacitor current $I_C$ (designated a first output current $I_{out1}$) until the time $t_d+t_{r1}$. The first output current $I_{out1}$, however, exceeds the maximum output current $I_{max}$.

Through the operation of the power train, the output voltage $V_{out}$ linearly ramps up with a reduced slope $S_2$ until a time $t_d+t_{r1}+t_{r2}$. The output current $I_{out}$ maintains the sum of the load current $I_L$ and the capacitor current $I_C$ (designated a second output current $I_{out2}$) until the time $t_d+t_{r1}+t_{r2}$. The second output current $I_{out2}$, however, also exceeds the maximum output current $I_{max}$.

Through the operation of the power train, the output voltage $V_{out}$ linearly ramps up with a reduced slope $S_3$ to the steady-state nominal output voltage $V_{nom}$ at a time $t_d+t_{r1}+t_{r2}+t_{r3}$. As a result, the sum of the load current $I_L$ and the capacitor current $I_C$ of the output capacitor $C_{out}$ drops to the maximum output current $I_{max}$. After reaching the steady-state nominal output voltage $V_{nom}$, the output current $I_{out}$ levels off at the load current $I_L$. Thus, the rise time $t_{r3}$ and slope $S_3$ of the output voltage $V_{out}$ are adjusted so that the first and second output currents $I_{out1}$, $I_{out2}$ are reduced to the maximum output current $I_{max}$.

A power converter including an output capacitor ($C_{out}$) couplable in parallel to a dissipative load (LD) (drawing a load current ($I_L$)) has been introduced herein. The power converter includes a power train (240) configured to convert an input voltage ($V_{in}$) to a nominal output voltage ($V_{nom}$) and a controller (210) including a processor (220) and memory (230). The controller (210) is configured to ramp up an output voltage ($V_{out}$) of the power converter with a first slope ($S_1$) (e.g., a default slope) and a second slope ($S_2$) (e.g., being reduced with respect to the first slope ($S_1$)), and receive a first output current ($I_{out1}$) of the power converter during a first rise time ($t_{r1}$) associated with the first slope ($S_1$) and a second output current ($I_{out2}$) of the power converter during a second rise time ($t_{r2}$) associated with the second slope ($S_2$). The controller (210) is also configured to compute a capacitance of the output capacitor ($C_{out}$) employing the first and second output currents ($I_{out1}$, $I_{out2}$), the first and second rise times ($t_{r1}$, $t_{r2}$) (and/or the first and second slopes ($S_1$, $S_2$)), and the nominal output voltage ($V_{nom}$).

The controller (210) is further configured to compute a current ($I_C$) supplied to the output capacitor ($C_{out}$) employing the first output current ($I_{out1}$) of the power converter during the first rise time ($t_{r1}$) and the second output current ($I_{out2}$) of the power converter during the second rise time ($t_{r2}$). The controller (210) is also configured to receive the first output current ($I_{out1}$) and select the second rise time ($t_{r2}$) so that the second output current ($I_{out2}$) does not exceed a maximum output current ($I_{max}$) of the power converter. The controller (210) is also configured to shut down the power converter if the output voltage ($V_{out}$) cannot reach a minimum output voltage threshold ($V_{min}$). The controller (210) is also configured to select a third slope ($S_3$) associated with a third rise time ($t_{r3}$) if the second output current ($I_{out2}$) is greater than a maximum output current ($I_{max}$) or exceeds an over-current protection level ($I_{OCP}$).

Figure 7:
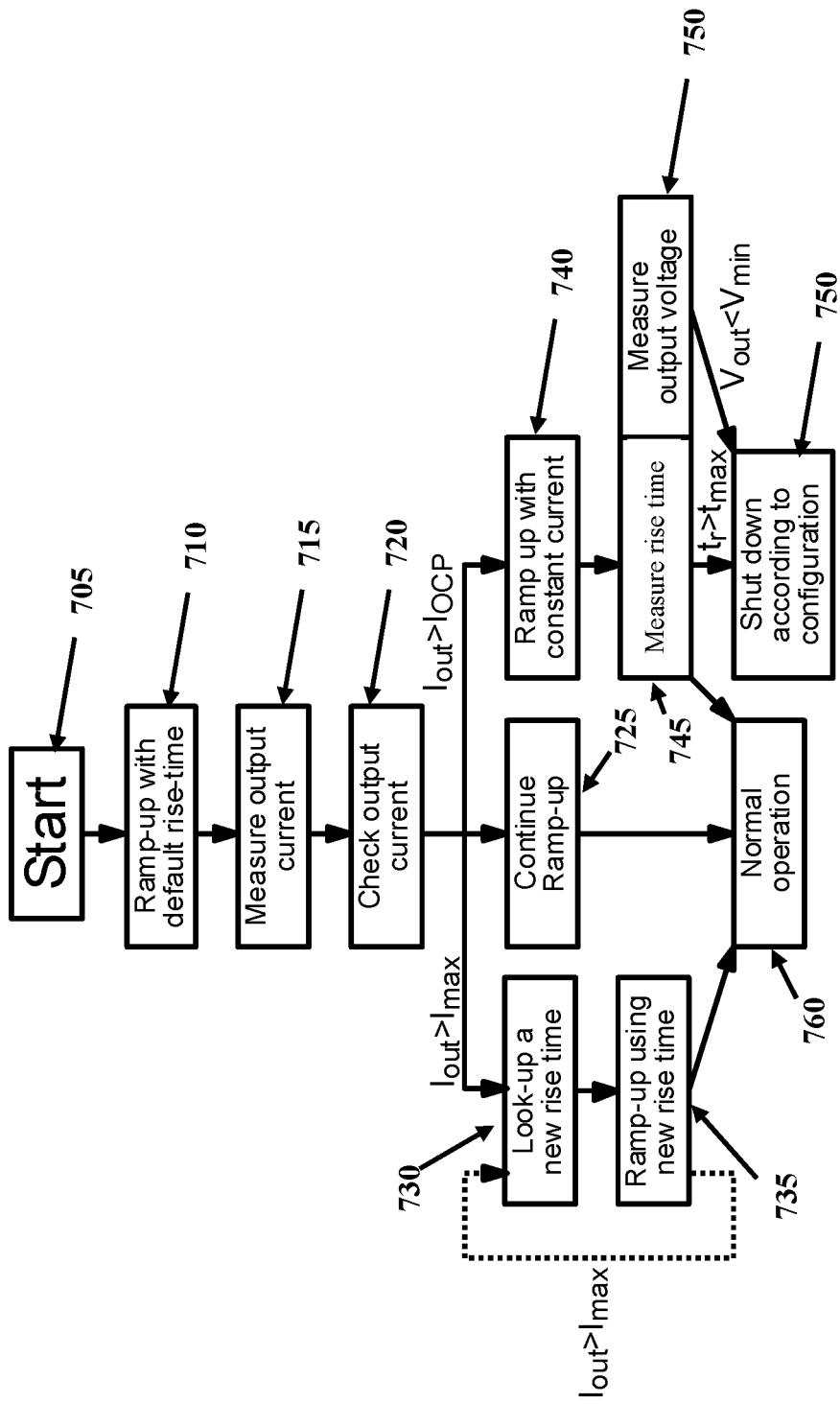
FIGS. 7 and 8 illustrate flow diagrams of embodiments of methods of operating a power converter.

Turning now to FIG. 7, illustrated is a flow diagram of an embodiment of a method of operating a power converter. The method is operable to measure parameters such as an output voltage $V_{out}$, an output current $I_{out}$ and rise times $t_r$ to compute a capacitance of an output capacitor of a power converter and begins at a start step or module 705. Through operation of a power train of the power converter, the output voltage $V_{out}$ of the power converter is ramped up having an initial default slope with a default rise time $t_r$ at a step or module 710. Thereafter, the output current $I_{out}$ of the power converter is measured at a step or module 715. At a step or module 720, the output current $I_{out}$ is compared against a maximum output current $I_{max}$ or an over-current protection limit $I_{OCP}$ of the power converter. If the output current $I_{out}$ is less than the maximum output current $I_{max}$ and the over-current protection limit $I_{OCP}$, the output voltage $V_{out}$ continues to be ramped up with the initial slope, at a step or module 725, until the output voltage $V_{out}$ reaches a nominal output voltage $V_{nom}$ and normal operation is attained at a step or module 760.

If the output current $I_{out}$ is greater than the maximum output current $I_{max}$, a new slope and rise time $t_r$ are determined, in a step or module 730, and the output voltage $V_{out}$ of the power converter is ramped up having the new slope with the new rise time $t_r$ at a step or module 735. If the output current $I_{out}$ continues to be greater than the maximum output current $I_{max}$ (as demonstrated by the dotted path), the step or modules 730, 735 are repeated until the output current $I_{out}$ is less than the maximum output current $I_{max}$ and then the power converter transitions to normal operation as depicted in the step or module 760.

If the output current $I_{out}$ is greater than the over-current protection limit $I_{OCP}$, the output voltage $V_{out}$ of the power converter is ramped up having a new slope with a new rise time $t_r$ and a constant current in a step or module 740. Thereafter, the rise time $t_r$ is measured in a step or module 745 and the output voltage $V_{out}$ is measured in a step or module 750. If the rise time $t_r$ is greater than a maximum rise time or the output voltage $V_{out}$ is less than a minimum output voltage threshold, then the power converter is shut down in a step or module 755. For example, the power converter may stop until a reset signal is obtained, which is also known as "latched protection," or, in another configuration, a retry is attempted within a certain time, also known as a "hick-up." Thus, during the constant current ramp-up, the output voltage $V_{out}$ is also monitored and if the output voltage $V_{out}$ remains lower than the minimum output voltage threshold, the power converter shuts down according to the configuration. If neither one of the conditions are met, then the power converter transitions to normal operation as depicted in the step or module 760.

Measuring output current $I_{out}$ of the power converter employing the process illustrated in FIG. 7 using a plurality of slopes for the output voltage $V_{out}$ in at least two time intervals enables computation of the capacitance coupled across the output of the power converter. As an option, the look-up of a new rise time $t_r$ can be performed several times, if, for instance, the output current $I_{out}$ changes during the ramp-up interval. If the output current $I_{out}$ increases too much above the over-current protection level $I_{OCP}$, a constant current ramp-up state can be entered.

Figure 8:
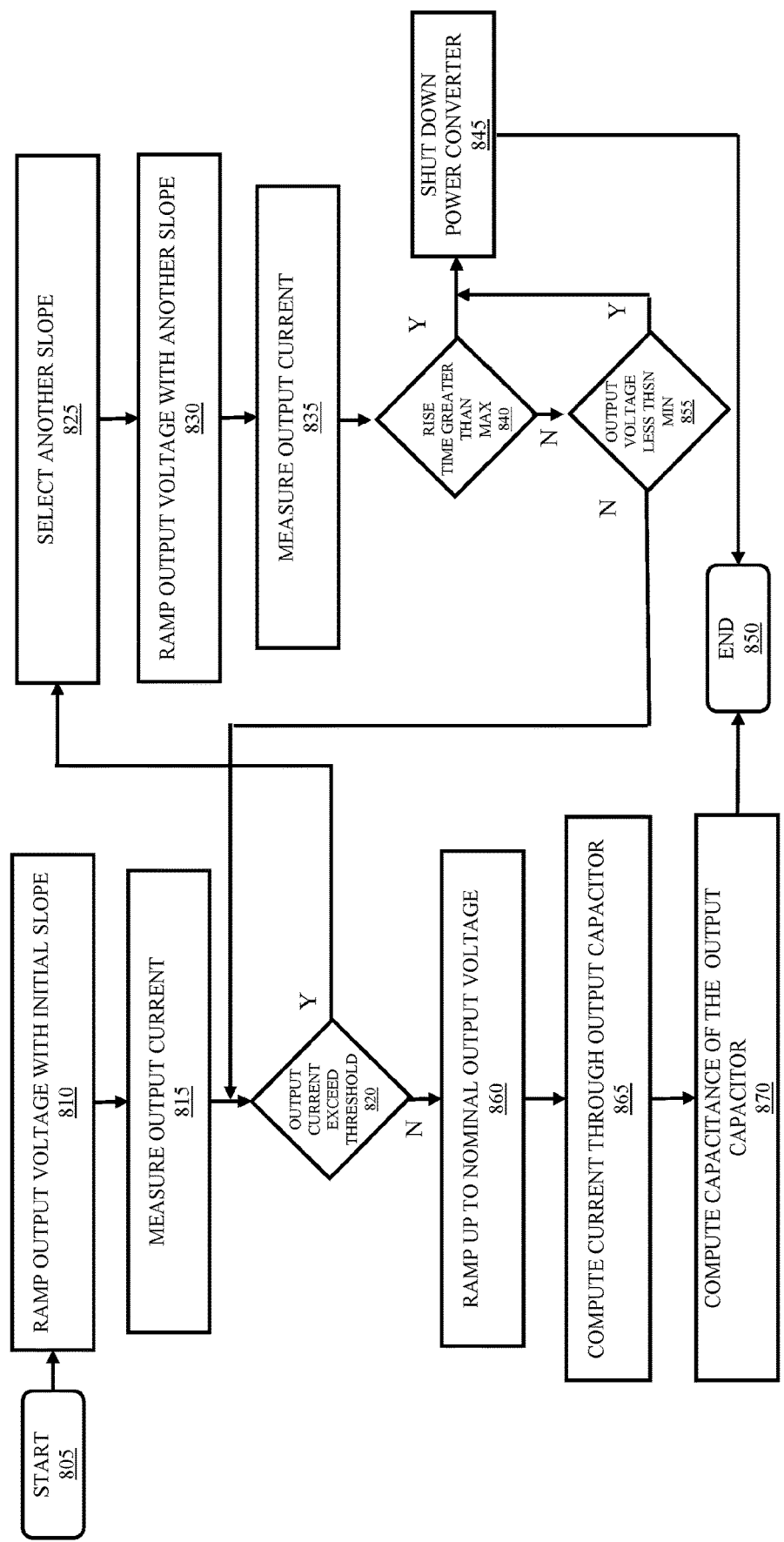

Turning now to FIG. 8, illustrated is a flow diagram of an embodiment of a method of operating a power converter. The power converter is configured to convert an input voltage to a nominal output voltage. In an embodiment, the power converter includes a power train with an output capacitor couplable in parallel to a dissipative load (drawing a load current). The method begins at a start step or module 805. At a step or module 810, the method includes ramping up the output voltage of the power converter with an initial slope (e.g., a default slope), then receiving and measuring an output current of the power converter during an initial rise time associated with the initial slope at a step or module 815.

At a decisional step or module 820, the method includes determining if the output current of the power converter exceeds a threshold such as a maximum output current and/or an over-current protection limit. If the output current exceeds the threshold, the method includes selecting another slope (e.g., being reduced with respect to the initial slope) at a step or module 825 and then ramping up the output voltage with the another slope at a step or module 830. At a step or module 835, the method includes receiving and measuring the output current of the power converter during another rise time associated with the another slope.

When the threshold is the over-current protection limit, the method includes determining if the another rise time is greater than a maximum rise time at a decisional step or module 840. If the another rise time is greater than a maximum rise time, then the method includes shutting down the power converter at a step or module 845 and then the method ends at a step or module 850. If the another rise time is not greater than a maximum rise time, then the method determines if the output voltage is less than a minimum output voltage threshold at a decisional step or module 855. If the output voltage is less than a minimum output voltage threshold, then the method includes shutting down the power converter at the step or module 845 and then the method ends at the step or module 850. If the output voltage is not less than a minimum output voltage threshold, then the method returns to the decisional step or module 820.

Returning to the decisional step or module 820, if the output current does not exceed the threshold, the method includes ramping up the output voltage at the present slope until the output voltage reaches the nominal output voltage at a step or module 860. The method then includes computing a current of an output capacitor of the power converter at a step or module 865. At a step or module 870, the method includes computing a capacitance of the output capacitor and the method concludes at the step or module 850. The capacitance of the output capacitor is a function of the output current(s), the slopes and the rise time(s), and the nominal output voltage.

The foregoing description of embodiments of the present proposed solution has been presented for the purpose of illustration and description. It is not intended to be exhaustive or to limit the proposed solution to the present form disclosed. Alternations, modifications and variations can be made without departing from the spirit and scope of the present proposed solution.

As described above, the exemplary embodiment provides both a method and corresponding apparatus consisting of various modules providing functionality for performing the steps of the method. The modules may be implemented as hardware (embodied in one or more chips including an integrated circuit such as an application specific integrated circuit), or may be implemented as software or firmware for execution by a processor. In particular, in the case of firmware or software, the exemplary embodiment can be provided as a computer program product including a computer readable storage medium embodying computer program code (i.e., software or firmware) thereon for execution by the computer processor. The computer readable storage medium may be non-transitory (e.g., magnetic disks; optical disks; read only memory; flash memory devices; phase-change memory) or transitory (e.g., electrical, optical, acoustical or other forms of propagated signals-such as carrier waves, infrared signals, digital signals, etc.). The coupling of a processor and other components is typically through one or more busses or bridges (also termed bus controllers). The storage device and signals carrying digital traffic respectively represent one or more non-transitory or transitory computer readable storage medium. Thus, the storage device of a given electronic device typically stores code and/or data for execution on the set of one or more processors of that electronic device such as a controller.

Although the embodiments and its advantages have been described in detail, it should be understood that various changes, substitutions, and alterations can be made herein without departing from the spirit and scope thereof as defined by the appended claims. For example, many of the features and functions discussed above can be implemented in software, hardware, or firmware, or a combination thereof. Also, many of the features, functions, and steps of operating the same may be reordered, omitted, added, etc., and still fall within the broad scope of the various embodiments.

Moreover, the scope of the various embodiments is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized as well. Accordingly, the appended claims are intended to include within their scope such processes, machines, manufacture, compositions of matter, means, methods, or steps.

The invention claimed is:

1. A controller for use with a power converter coupled to an output capacitor including a power train configured to convert an input voltage to a nominal output voltage, the controller comprising:
   a processor; and
   a memory including computer program code, wherein the processor, the memory, and the computer program code are collectively operable to:
      ramp up an output voltage of the power converter with a first slope and a second slope,
      receive a first output current of the power converter during a first rise time associated with the first slope and a second output current of the power converter during a second rise time associated with the second slope, and
      compute a capacitance of the output capacitor employing the first and second output currents, the first and second rise times, and the nominal output voltage,
      wherein the memory and the computer program code are further configured to, with the processor cause the controller to select a third slope associated with a third rise time if the second output current is greater than a maximum output current.

2. The controller as recited in claim 1, wherein the memory and the computer program code are further configured to, with the processor cause the controller to compute a current supplied to the output capacitor employing the first output current of the power converter during the first rise time and the second output current of the power converter during the second rise time.

3. The controller as recited in claim 1, wherein the memory and the computer program code are further configured to, with the processor cause the controller to receive the first output current and select the second rise time so that the second output current does not exceed a maximum output current of the power converter.

4. The controller as recited in claim 1, wherein the memory and the computer program code are further configured to, with the processor cause the controller to shut down the power converter if the output voltage cannot reach a minimum output voltage threshold.

5. A power converter coupled to an output capacitor, comprising:
   a power train configured to convert an input voltage to a nominal output voltage; and
   a controller configured to:
      ramp up an output voltage of the power converter with a first slope and a second slope,
      receive a first output current of the power converter during a first rise time associated with the first slope and a second output current of the power converter during a second rise time associated with the second slope, and
      compute a capacitance of the output capacitor employing the first and second output currents, the first and second rise times and the nominal output voltage,
      wherein the controller is configured to select a third slope associated with a third rise time if the second output current is greater than a maximum output current.

6. The power converter as recited in claim 5, wherein the controller is configured to cause the power converter to select the third slope if the second output current exceeds an over-current protection level.

7. The power converter as recited in claim 5, wherein the controller is further configured to compute a current supplied to the output capacitor employing the first output current of the power converter during the first rise time and the second output current of the power converter during the second rise time.

8. The power converter as recited in claim 5, wherein the output capacitor is couplable in parallel to a dissipative load.

9. The power converter as recited in claim 8, wherein the dissipative load is configured to conduct a load current.

10. The power converter as recited in claim 5, wherein the controller is configured to receive the first output current and select the second rise time so that the second output current does not exceed a maximum output current of the power converter.

11. The power converter as recited in claim 5, wherein the second slope is reduced with respect to the first slope.

12. The power converter as recited in claim 5, wherein the controller is configured to shut down the power converter if the output voltage cannot reach a minimum output voltage threshold.

13. The power converter as recited in claim 5, wherein the first slope is a default slope.

14. A method of operating a power converter coupled to an output capacitor including a power train configured to convert an input voltage to a nominal output voltage, the method, comprising:
   ramping up an output voltage of the power converter with a first slope and a second slope;
   receiving a first output current of the power converter during a first rise time associated with the first slope and a second output current of the power converter during a second rise time associated with the second slope;
   computing a capacitance of the output capacitor employing the first and second output currents, the first and second rise times, and the nominal output voltage; and
   selecting a third slope associated with a third rise time if the second output current is greater than a maximum output current.

15. The method as recited in claim 14 further comprising receiving the first output current and selecting the second rise time so that the second output current does not exceed a maximum output current of the power converter.

16. The method as recited in claim 14 further comprising shutting down the power converter if the output voltage cannot reach a minimum output voltage threshold.

17. The method as recited in claim 14 further comprising computing a current supplied to the output capacitor employing the first output current of the power converter during the first rise time and the second output current of the power converter during the second rise time.

* * * * *